United States Patent
Neidhart et al.

(10) Patent No.: US 8,859,409 B2
(45) Date of Patent: Oct. 14, 2014

(54) SEMICONDUCTOR COMPONENT COMPRISING A DOPANT REGION IN A SEMICONDUCTOR BODY AND A METHOD FOR PRODUCING A DOPANT REGION IN A SEMICONDUCTOR BODY

(75) Inventors: Thomas Neidhart, Klagenfurt (AT); Franz Josef Niedernostheide, Muenster (DE); Hans-Joachim Schulze, Taufkirchen (DE); Werner Schustereder, Villach (AT); Alexander Susiti, Stadelach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/613,985

(22) Filed: Sep. 13, 2012

(65) Prior Publication Data
US 2013/0249058 A1    Sep. 26, 2013

(30) Foreign Application Priority Data
Sep. 15, 2011    (DE) .......................... 10 2011 113 549

(51) Int. Cl.
| H01L 21/425 | (2006.01) |
|---|---|
| H01L 29/167 | (2006.01) |
| H01L 29/36 | (2006.01) |
| H01L 29/32 | (2006.01) |
| H01L 29/861 | (2006.01) |
| H01L 21/265 | (2006.01) |

(52) U.S. Cl.
CPC .......... *H01L 29/36* (2013.01); *H01L 21/26506* (2013.01); *H01L 29/167* (2013.01); *H01L 21/265* (2013.01); *H01L 29/32* (2013.01); *H01L 29/861* (2013.01)
USPC ............ 438/530; 438/526; 438/554; 438/550

(58) Field of Classification Search
IPC ............ H01L 21/3225,21/324, 21/3221, 29/36, H01L 29/32, 21/02032
See application file for complete search history.

(56) References Cited

U.S. PATENT DOCUMENTS
2011/0275202 A1    11/2011   Mauder et al.

FOREIGN PATENT DOCUMENTS
| DE | 102004047749 A1 | 4/2006 |
|---|---|---|
| DE | 102007033873 A1 | 1/2009 |

OTHER PUBLICATIONS

Bruzzi et al., Thermal donors formation via isothermal annealing in magnetic Czochralski high resistivity silicon, Journal of Applied Physics 99, 093706 (2006).*

* cited by examiner

*Primary Examiner* — Eva Yan Montalvo
(74) *Attorney, Agent, or Firm* — Murphy, Bilak & Homiller, PLLC

(57) ABSTRACT

A semiconductor component includes a semiconductor body having a first side and a second side opposite the first side. In the semiconductor body, a dopant region is formed by a dopant composed of an oxygen complex. The dopant region extends over a section L having a length of at least 10 μm along a direction from the first side to the second side. The dopant region has an oxygen concentration in a range of $1 \times 10^{17}$ cm$^{-3}$ to $5 \times 10^{17}$ cm$^{-3}$ over the section L.

16 Claims, 4 Drawing Sheets

SEMICONDUCTOR COMPONENT COMPRISING A DOPANT REGION IN A SEMICONDUCTOR BODY AND A METHOD FOR PRODUCING A DOPANT REGION IN A SEMICONDUCTOR BODY

PRIORITY CLAIM

This application claims priority to German Patent Application No. 10 2011 113 549.2, filed on 15 Sep. 2011, the content of said German application incorporated herein by reference in its entirety.

BACKGROUND

Dopant regions within a semiconductor body are required in all semiconductor components. Dopant regions which extend deep into the semiconductor body or are situated deep in the semiconductor body are required for some applications. A field stop zone of an IGBT (insulated gate bipolar transistor) or of a diode serves as an example of this. The production of such a field stop zone, i.e. of a zone of increased doping deep in the semiconductor body, is described, for example, in DE 10 2004 047 749 A1.

A field stop zone is usually produced by diffusion, particularly in the case of semiconductor wafers having a relatively small diameter($\leq$6 inches) or thicknesses of above 200 µm. In this case, by way of example, for the production of an n-type dopant region as a field stop zone, either phosphorus or selenium atoms are indiffused into the semiconductor body. This usually results in doping profiles having a Gaussian distribution and a penetration depth into the semiconductor body of typically between 1 µm and 30 µm.

Field stop zones, which have to be produced at relatively low temperatures on account of the semiconductor wafer thickness and the wafer diameter, are usually produced by proton implantation. In this case, temperatures in the range of 400° C. are usually sufficient for producing the desired n-doped field stop zones. What is disadvantageous in this case, however, is that the resulting doping profile of the field stop zone has a considerable undulation. This can lead e.g. to an undesirable change in the gradient in the current and voltage profile during the turn-off operation of e.g. an IGBT. However, the undulation of the doping profile can in some cases adversely affect the softness of the turn-off operation.

SUMMARY

Exemplary embodiments of the invention relate to a semiconductor component comprising an extensive dopant region in a semiconductor body, which has a relatively small variation of the dopant concentration. In particular, exemplary embodiments relate to power semiconductor components comprising such a dopant region. Furthermore, exemplary embodiments of the invention relate to a method for producing such a dopant region in a semiconductor body.

It is an object of the invention to provide a semiconductor component comprising a dopant region, in particular a field stop zone, having a small variation of the dopant concentration. Moreover, the intention is to provide a method that makes it possible to produce such a dopant region in the semiconductor body.

Exemplary embodiments of the invention are explained in greater detail below. However, the invention is not restricted to the embodiments specifically described, but rather can be suitably modified and altered. It lies within the scope of the invention to combine individual features and feature combinations of one embodiment with features and feature combinations of another embodiment in a suitable manner, in order to arrive at further embodiments according to the invention.

In one embodiment, a semiconductor component comprises a semiconductor body having a first side and a second side situated opposite the first side, and a dopant region in the semiconductor body. In this case, the dopant region is formed by a dopant composed of an oxygen/vacancy complex over a section L having a length of at least 10 µm along a direction from the first side to the second side and has an oxygen concentration in the range of $1 \times 10^{17}$ cm$^{-3}$ to $5 \times 10^{17}$ cm$^{-3}$ over the section L. In a further embodiment, the dopant region has an oxygen concentration in the range of $2 \times 10^{17}$ cm$^{-3}$ to $5 \times 10^{17}$ cm$^{-3}$ over the section L. In yet another embodiment, the dopant region has an oxygen concentration in the range of $3 \times 10^{17}$ cm$^{-3}$ to $5 \times 10^{17}$ cm$^{-3}$ over the section L.

The specific oxygen concentration in the dopant region has the effect that dopants formed by an oxygen/vacancy complex can form. In this case, an oxygen/vacancy complex should be understood to mean a structure that comprises, inter alia, oxygen as a constituent without the oxygen in this case forming a chemical bond with other constituents of the complex. By virtue of the fact that the specific oxygen concentration extends over a section L, dopant formation can occur uniformly over the section L on account of the formation of oxygen/vacancy complexes. It is thus possible to provide a dopant region having a small variation of the dopant concentration. By way of example, the dopant region can have a dopant concentration that varies along the section L by maximally a factor of 15, furthermore for example by a factor of 10 and once again for example by a factor of 3.

One embodiment of the invention provides for the semiconductor body to be formed at least partly from a Czochralski semiconductor material and preferably from a magnetic Czochralski material. A Czochralski semiconductor material is a semiconductor material which is pulled from a melt according to the Czochralski method and which can be bought cost-effectively as a mass-produced product. In the case of magnetic Czochralski material, the oxygen concentration is reduced in a targeted manner by an external magnetic field being applied during the crystal growth.

In a further embodiment, the semiconductor body is formed at least partly from a float zone semiconductor material. A float zone semiconductor material is distinguished by the fact that a semiconductor material is briefly melted and then solidified again as a single crystal. A float zone semiconductor material has a very high purity.

In yet another embodiment, the semiconductor body comprises a semiconductor material epitaxial layer. The semiconductor material epitaxial layer can be produced on a monocrystalline substrate by arrangement of semiconductor material atoms from the gas phase onto the crystal lattice of the substrate. Through targeted control of the gas composition, it is possible to alter the epitaxial layer with regard to its composition in a desired manner.

In one exemplary embodiment, the semiconductor body has a basic doping with a basic dopant concentration, and the dopant region has a dopant concentration higher than the basic dopant concentration.

It is a further exemplary embodiment if the dopant is a thermal donor formed e.g. from a hydrogen-oxygen-lattice vacancy complex.

One embodiment of the invention is a power semiconductor component, comprising a semiconductor body having a first side and a second side situated opposite the first side. A first electrode is arranged at the first side and a second electrode is arranged at the second side of the semiconductor body. A pn junction in the semiconductor body is situated between the first electrode and the second electrode and a dopant region in the semiconductor body, which is formed by a dopant composed of an oxygen/vacancy complex over a section L having a length of at least 10 µm along a direction from the first side to the second side, has an oxygen concentration in the range of $1\times10^{17}$ cm$^{-3}$ to $5\times10^{17}$ cm$^{-3}$ over the section L.

In this case, a power semiconductor component should be understood to mean a semiconductor component in which voltages of more than 20 V, usually more than 500 V, are present between the first and second electrodes. In this case, a power semiconductor component is distinguished by the fact that a high voltage of more than 20 V present in the reverse direction across the pn junction does not lead to the destruction of the semiconductor component. In one exemplary embodiment, such a power semiconductor component comprises a so-called drift zone between the pn junction and one of the electrodes, in which drift zone a space charge zone can form over a wide section in order to avoid field strengths within the semiconductor body. In this case, the drift zone has a dopant concentration that is low relative to other dopant regions occurring in the semiconductor body. A power semiconductor component can be, for example, a diode, a MOSFET (metal oxide semiconductor field effect transistor) or an IGBT.

In one embodiment of such a power semiconductor component, the semiconductor body has a basic doping with a basic dopant concentration, and the dopant region has a dopant concentration higher than the basic dopant concentration. By way of example, in this case, a drift zone present in the semiconductor body can have the basic dopant concentration and the dopant region can be a field stop zone arranged in the drift zone and having a higher doping. The field stop zone prevents the punch-through of the electric field strength in the drift zone as far as the electrode.

For the so-called softness of the turn-off operation of the power semiconductor component, it can be advantageous if the dopant region has a dopant concentration that varies along the section L between adjacent doping maxima and doping minima for example by maximally a factor of 15, furthermore, for example, less than by a factor of 10 and once again, for example less than by a factor of 3. The fall in the doping concentration at the end of the section L toward the basic doping is not taken into account in the specification of these factors. This means, in particular, that the ratio of the height of adjacent doping peaks to directly adjacent doping minima varies by less than a factor of 15 or 10 or 3.

It is one exemplary embodiment of a method according to the invention for producing a dopant region in a semiconductor body if a semiconductor body having a first side and a second side situated opposite the first side is provided, wherein in the semiconductor body at least one partial region is formed over a section L of at least 10 µm in a direction from the first side to the second side, the at least one partial region having an oxygen concentration in the range of $1\times10^{17}$ cm$^{-3}$ to $5\times10^{17}$ cm$^{-3}$. In the course of heat treating at least the partial region in a temperature range of between 350° C. and 450° C., a dopant region comprising a dopant composed of an oxygen/vacancy complex formed in the partial region over the section L.

In one embodiment, the partial region is formed by setting the oxygen supply during the crystal growth of the semiconductor body in a Czochralski method.

In another embodiment, the partial region is formed by setting the oxygen supply from the gas phase during an epitaxial deposition of the semiconductor body on a semiconductor substrate.

In a further embodiment, the partial region is formed by outdiffusion of oxygen from a substrate into an epitaxial layer deposited thereon.

A further exemplary embodiment provides for the partial region to be formed by indiffusion of oxygen via the first side or via the second side into the semiconductor body.

It is yet another exemplary embodiment if the partial region is formed by implantation of oxygen into the semiconductor body.

One development of the method provides for the oxygen concentration in the partial region to vary along the section L. By way of example, it can be advantageous if the oxygen concentration decreases in a direction toward the first side. This can lead to an effective smoothing of the dopant profile within the dopant region.

One exemplary embodiment provides for the semiconductor body to be thinned before the formation of the partial region at the second side.

Furthermore, one embodiment of the method provides for hydrogen to be introduced at least into the partial region before the heat treatment. This can firstly accelerate the diffusion of oxygen atoms and/or facilitate dopant formation. By way of example, the hydrogen is introduced by implantation of hydrogen ions. Moreover, the implantation or indiffusion can be effected with at least two different implantation energies, such that hydrogen accumulations are produced at different depths in the partial region. In conjunction with the increased oxygen concentration in the partial region this can lead to the formation of dopant concentration profiles in the partial region which vary spatially to a lesser extent than in a region having an oxygen concentration that is significantly less than $1\times10^{17}$ cm$^{-3}$.

In one exemplary embodiment of the method, the heat treatment is effected over a time period of 30 minutes to 5 hours and preferably between 1 hour and 4 hours. The annealing temperature is typically in the range of between 350° C. and 450° C. It is thereby possible to achieve, for example, a relatively weakly varying dopant distribution of the dopant concentration in the dopant region over the section L.

In one development of the method, the dopant region is predominantly formed by thermal donors formed from a hydrogen-oxygen-lattice vacancy complex. In one exemplary embodiment, for this purpose in the semiconductor body, lattice vacancies are produced at least in the partial region before the heat treatment.

A further embodiment of the method provides for the dopant region to acquire a dopant concentration that varies at least along the section L between adjacent doping maxima and doping minima by maximally a factor of 15, preferably 10 and particularly preferably 3.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 4, which includes

DETAILED DESCRIPTION

Before the exemplary embodiments of the present invention are explained in greater detail below with reference to the figures, it is pointed out that identical elements in the figures are provided with the same or similar reference signs and that a repeated description of these elements is omitted. Furthermore, the figures are not necessarily true to scale, rather the main emphasis is on elucidating the basic principle.

Figure 1:
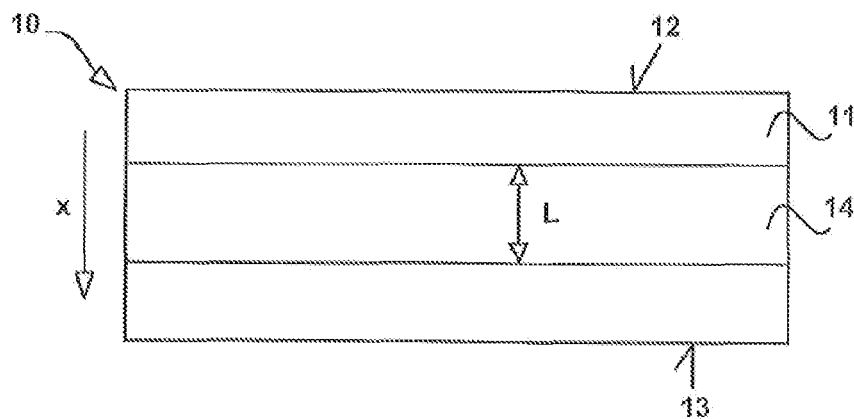
FIG. 1 shows a semiconductor component comprising a dopant region in a semiconductor body.

FIG. 1 illustrates a semiconductor component 10 comprising a semiconductor body 11 having a first side 12 and a second side 13 situated opposite the first side 12. The semiconductor component 10 can be a diode or an IGBT, for example, wherein the possible embodiments of the invention are not restricted to these two types of semiconductor component.

In the exemplary embodiment shown, the semiconductor body 11 can be formed at least partly from either a Czochralski semiconductor material or magnetic Czochralski semiconductor material, or a float zone semiconductor material or a semiconductor material epitaxial layer. The semiconductor body 11 is generally present as a semiconductor wafer, from which one or more semiconductor components are then produced. The semiconductor wafer can have a wafer diameter which, in the present case, is for example >200 mm. The diameter can be 300 mm, for example. The thickness of the semiconductor body 11 is normally approximately 750 µm, but can also be smaller. By way of example, the semiconductor body thickness can be less than 200 µm. FIG. 1 furthermore illustrates a dopant region 14 in the semiconductor body 11. The dopant region 14 is formed by a dopant composed of an oxygen/vacancy complex. The dopant can be formed, for example, from a hydrogen-oxygen-lattice vacancy complex. The dopant region 14 extends over a section L having a length of at least 10 µm along a direction X from the first side 12 to the second side 13. In this case, the dopant region 14 has an oxygen concentration in the range of $1 \times 10^{17}$ cm$^{-3}$ to $5 \times 10^{17}$ cm$^{-3}$ over the section L. In one embodiment, the oxygen concentration can be in a range of $2 \times 10^{17}$ cm$^{-3}$ to $5 \times 10^{17}$ cm$^{-3}$. In a further embodiment, the oxygen concentration can even just lie in a range of $3 \times 10^{17}$ cm$^{-1}$ to $5 \times 10^{17}$ cm$^{-1}$.

The semiconductor body 11 has a basic doping with a basic dopant concentration. The dopant region 14 has a dopant concentration higher than the basic dopant concentration. In a development relative to the exemplary embodiment from FIG. 1, the semiconductor component is a power semiconductor component.

Figure 2:
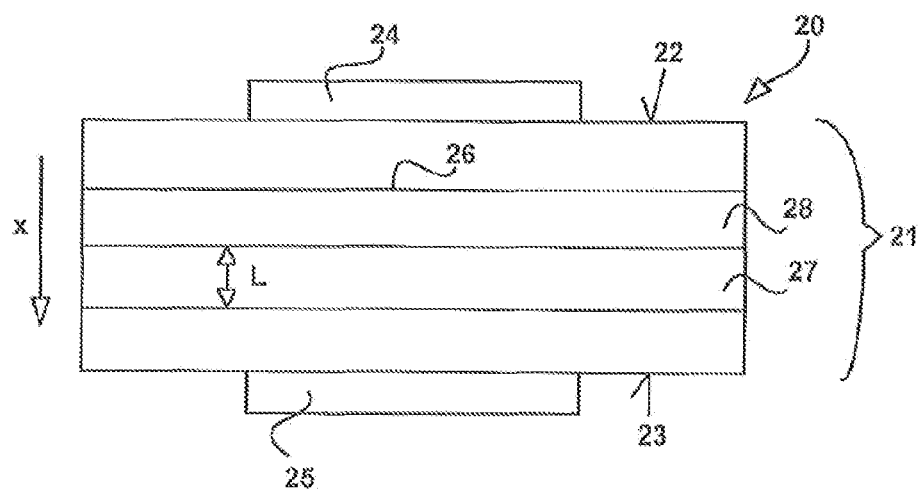
FIG. 2 shows a power semiconductor component comprising electrodes on opposite sides of a semiconductor body and comprising a dopant region in the semiconductor body.

FIG. 2 shows an exemplary embodiment of a power semiconductor component 20, comprising a semiconductor body 21 having a first side 22 and a second side 23 situated opposite the first side 22. A first electrode 24 is mounted at the first side 22 of the semiconductor body 21. At the second side 23, a second electrode 25 is mounted on the semiconductor body 21. In the semiconductor body 21, a pn junction 26 is situated between the first electrode 24 and the second electrode 25. The pn junction 26 is formed between a p-doped partial region of the semiconductor body 21 and an n-doped partial region of the semiconductor body 21. Furthermore, a dopant region 27 is situated in the semiconductor body 21. The dopant region 27 is formed by a dopant composed of an oxygen/vacancy complex. The dopant can be formed, for example, from a hydrogen-oxygen-lattice vacancy complex. The dopant region 27 extends over a section L having a length of at least 10 µm along a direction X from the first side 22 to the second side 23. The dopant region 27 has an oxygen concentration in the range of $1 \times 10^{17}$ cm$^{-3}$ to $5 \times 10^{17}$ cm$^{-3}$ over the section L.

The semiconductor body 21 of the power semiconductor component 20 normally has a basic doping with a basic dopant concentration. The basic doping is often used in a drift zone or base zone 28 of the power semiconductor component 20. The drift zone 28 lies between the pn junction 26 and the dopant region 27. The dopant region 27 can be a field stop zone, for example.

Figure 3:
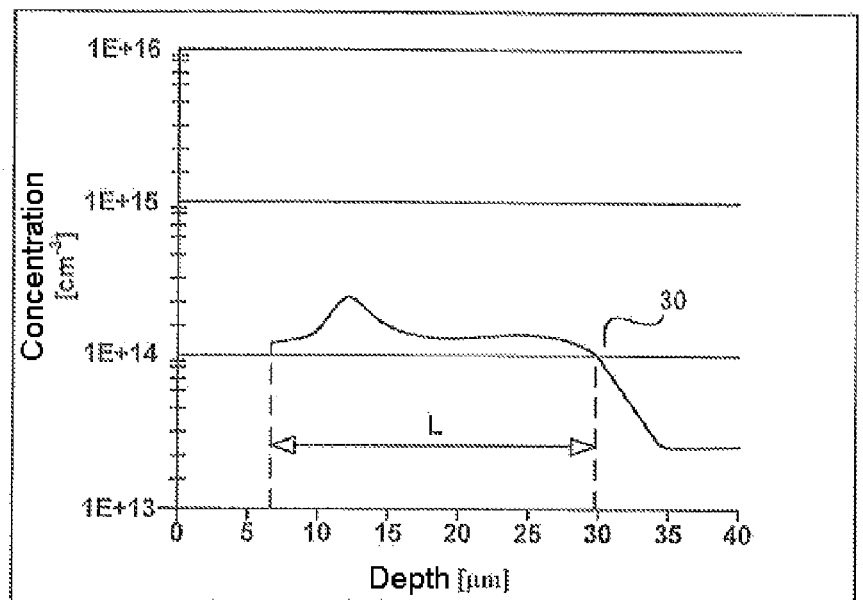
FIG. 3 shows a dopant profile in a semiconductor body of a semiconductor component.

FIG. 3 illustrates an example of a dopant profile within a semiconductor body having a dopant region. The semiconductor body has a basic doping with a basic dopant concentration 30. In this case, the basic dopant concentration 30 is in the range of $1 \times 10^{13}$ cm$^{-3}$ to $1 \times 10^{14}$ cm$^{-3}$. The basic dopant concentration can be used for forming a drift zone or base zone within a power semiconductor component. The semiconductor body furthermore has the dopant region of a section L, wherein the dopants are predominantly formed by an oxygen/vacancy complex and the dopant concentration is above the basic dopant concentration. This higher dopant concentration has values in the range of $1 \times 10^{14}$ cm$^{-3}$ to $1 \times 10^{15}$ cm$^{-3}$. Moreover, the higher dopant concentration varies over the section L maximally by a factor of 3.

Figure 6:
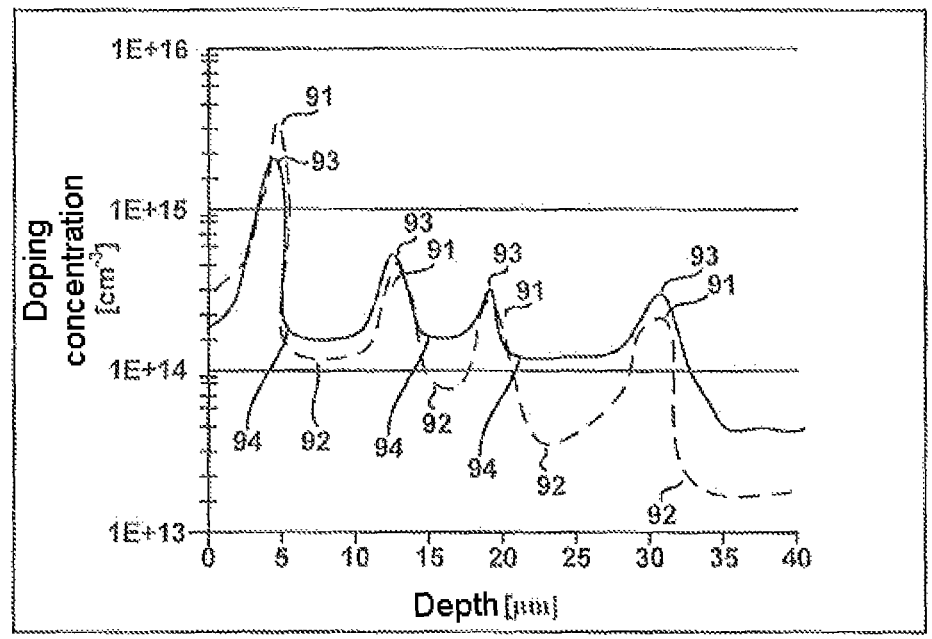
FIG. 6 shows a dopant profile in a semiconductor body of a semiconductor component.

FIG. 6 shows a further example of a dopant profile within a semiconductor body having a dopant region. FIG. 6 shows a dopant concentration in a dopant region in which the basic dopant concentration has a high undulation, with maxima 91 and minima 92. In the case of an oxygen content, or in the case of an oxygen concentration of $1 \times 10^{17}$ cm$^{-3}$ to $5 \times 10^{17}$ cm$^{-3}$, the undulation of the maxima 93 and minima 94 decreases greatly. With an oxygen concentration of $1 \times 10^{17}$ cm$^{-3}$ to $5 \times 10^{17}$ cm$^{-3}$, the doping concentration varies in such a way that a doping concentration maximum and an adjacent doping concentration minimum differ maximally by a factor of 15, preferably by a factor of maximally 10.

Figure 4A:
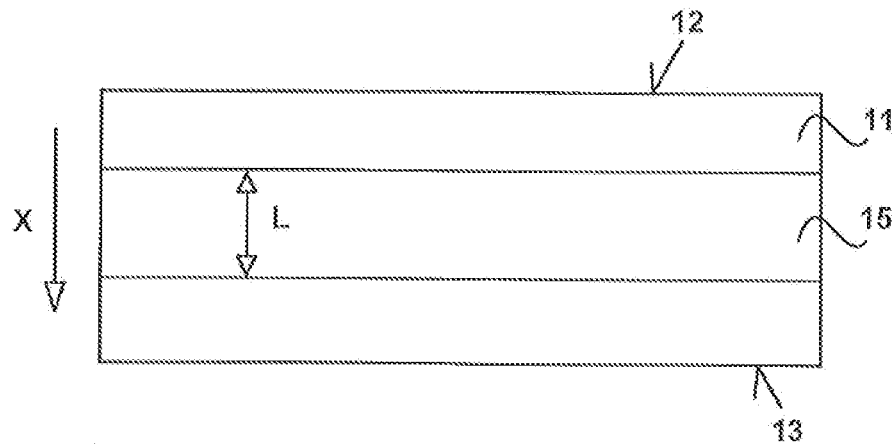
FIG. 4a and FIG. 4b, shows a method for producing a dopant region in a semiconductor body.

FIG. 4a illustrates a first intermediate result of a method for producing a dopant region in a semiconductor body. For this purpose, a semiconductor body 11 having a first side 12 and a second side 13 situated opposite the first side 12 is provided. In the semiconductor body 11, at least one partial region 15 is formed over a section L of at least 10 µm in a direction X from the first side 12 to the second side 13. The at least one partial region 15 has an oxygen concentration in the range of $1 \times 10^{17}$ cm$^{-3}$ to $5 \times 10^{17}$ cm$^{-3}$. The partial region 15 can be formed, for example, during the crystal growth of the semiconductor body 11. Thus, the formation of the partial region 15 can be formed for example in a Czochralski method, e.g. a magnetic Czochralski method. In another example, the partial region 15 can also be formed by setting the oxygen supply from the gas phase during an epitaxial deposition of the semiconductor body 11 on a semiconductor substrate. Furthermore, the partial region 15 can be formed by outdiffusion of oxygen from a substrate into an epitaxial layer deposited thereon. An epitaxial layer can be used e.g. for producing drift zones or base zones in power semiconductor components. In a further example, the partial region 15 can be formed by indiffusion of oxygen via the first side 12 or via the second side 13 into the semiconductor body 11. In the case of indiffusion via the first side 12, e.g. during the processing of power semiconductor components the oxygen should be indiffused into the semiconductor body 11 already before a polishing of the first side 12 of the semiconductor body 11, in order to ensure that the oxygen atoms are indiffused as deeply as possible. In yet another example, the partial region 15 can be formed by implantation of oxygen into the semiconductor body 11, wherein suitable indiffusion steps are usually carried out after the implantation.

Depending on the way in which the oxygen is introduced, it is possible to set the oxygen concentration in the partial region 15 along the section L in such a way that the oxygen concentration in the partial region 15 decreases along the section L. In this case, the oxygen concentration can also be set such that it decreases in a direction toward the first side 12. An embodiment that is not illustrated provides for the semiconductor body 11 to be thinned before the formation of the partial region 15 at the second side 13. This can play an important part for example during the indiffusion of the oxygen via the second side 13 into the semiconductor body 11.

Figure 5:
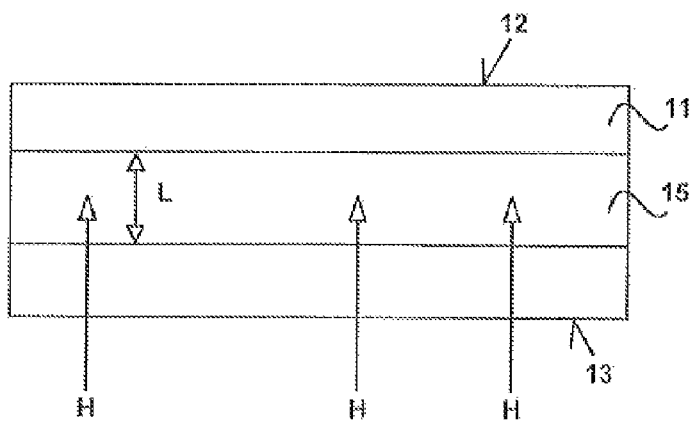
FIG. 5 shows the introduction of hydrogen into a partial region of a semiconductor body.
Figure 4B:
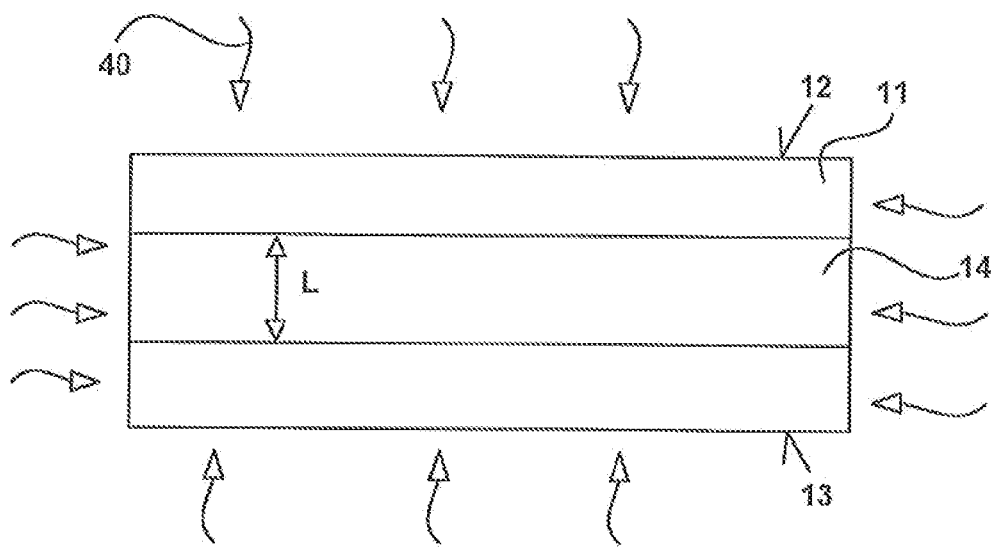

FIG. 4b illustrates the semiconductor body 11, in which, by means of heat treatment 40 (represented as arrows in FIG. 4b) at least of the partial region 15 in a temperature range of between 350° C. and 450° C., a dopant region 14 is formed by means of an oxygen/vacancy complex having a doping effect in the partial region 15 over the section L. In this case, hydrogen H can be introduced at least into the partial region 15 before the heat treatment 40. This is shown in FIG. 5. The hydrogen can be introduced, for example, by implantation of hydrogen ions. In this case, the implantation can also be effected with at least two different implantation energies. This gives rise, in the partial region 15, to hydrogen accumulations and also greatly increased vacancy densities at different depths. If, by way of example, the dopants in the dopant region 14 are formed from a hydrogen-oxygen-lattice vacancy complex, so-called thermal donors, the hydrogen accumulation at different depths of the partial region 15 makes it possible to achieve a very homogeneous distribution of the dopants in the dopant region 14 over the section L. Furthermore, lattice vacancies or additional lattice vacancies can be produced in the semiconductor body 11 before the heat treatment 40 at least in the partial region 15 preferably by means of hydrogen implantation. This can foster e.g. the formation of hydrogen-oxygen-lattice vacancy complexes.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a dopant region in a semiconductor body, the method comprising:
    providing a semiconductor body having a first side and a second side opposite the first side, wherein in the semiconductor body at least one partial region is formed over a section L of at least 10 µm in a direction from the first side to the second side, the at least one partial region having an oxygen concentration in a range of $1 \times 10^{17}$ $cm^{-3}$ to $5 \times 10^{17}$ $cm^{-3}$;
    heat treating at least the partial region in a temperature range between 350° C. and 450° C. so that a dopant region comprising a dopant composed of an oxygen complex forms in the partial region over the section L; and
    introducing hydrogen at least into the partial region before the heat treatment.

2. The method as claimed in claim 1, wherein the partial region is formed by setting an oxygen supply during crystal growth of the semiconductor body in a magnetic Czochralski method.

3. The method as claimed in claim 1, wherein the partial region is formed by setting an oxygen supply from a gas phase during an epitaxial deposition of the semiconductor body on a semiconductor substrate.

4. The method as claimed in claim 1, wherein the partial region is formed by outdiffusion of oxygen from a substrate into an epitaxial layer deposited on the substrate.

5. The method as claimed in claim 1, wherein the partial region is formed by indiffusion of oxygen via the first side or via the second side into the semiconductor body.

6. The method as claimed in claim 1, wherein the partial region is formed by implantation of oxygen into the semiconductor body.

7. The method as claimed in claim 1, wherein the oxygen concentration in the partial region decreases along the section L.

8. The method as claimed in claim 7, wherein the oxygen concentration decreases in a direction toward the first side.

9. The method as claimed in claim 1, further comprising thinning the semiconductor body at the second side before the formation of the partial region.

10. The method as claimed in claim 1, wherein the hydrogen is introduced by implantation of hydrogen ions.

11. The method as claimed in claim 10, wherein the implantation of hydrogen ions is effected with at least two different implantation energies so that hydrogen accumulations are produced at different depths in the partial region.

12. The method as claimed in claim 1, wherein the heat treatment takes place over a time period of 30 minutes to 5 hours.

13. The method as claimed in claim 1, wherein the dopant region is predominantly formed by dopants formed from a hydrogen-oxygen-lattice vacancy complex.

14. The method as claimed in claim 1, wherein in the semiconductor body, lattice vacancies are produced at least in the partial region before the heat treatment.

15. A method for producing a dopant region in a semiconductor body, the method comprising:
    providing a semiconductor body having a first side and a second side opposite the first side, wherein in the semiconductor body at least one partial region is formed over a section L of at least 10 µm in a direction from the first side to the second side, the at least one partial region having an oxygen concentration in a range of $1 \times 10^{17}$ cm$^{-3}$ to $5 \times 10^{17}$ cm$^{-3}$; and heat treating at least the partial region in a temperature range between 350° C. and 450° C. so that a dopant region comprising a dopant composed of an oxygen complex forms in the partial region over the section L;

wherein the partial region is formed by any one of: setting an oxygen supply from a gas phase during an epitaxial deposition of the semiconductor body on a semiconductor substrate, outdiffusion of oxygen from a substrate into an epitaxial layer deposited on the substrate, indiffusion of oxygen via the first side or via the second side into the semiconductor body, and implantation of oxygen into the semiconductor body.

16. A method for producing a dopant region in a semiconductor body, the method comprising:

providing a semiconductor body having a first side and a second side opposite the first side, wherein in the semiconductor body at least one partial region is formed over a section L of at least 10 µm in a direction from the first side to the second side, the at least one partial region having an oxygen concentration in a range of $1 \times 10^{17}$ cm$^{-3}$ to $5 \times 10^{17}$ cm$^{-3}$; and heat treating at least the partial region in a temperature range between 350° C. and 450° C. so that a dopant region comprising a dopant composed of an oxygen complex forms in the partial region over the section L;

wherein the oxygen concentration in the partial region decreases along the section L.

\* \* \* \* \*